US010438535B2

(12) United States Patent
Shaeffer et al.

(10) Patent No.: US 10,438,535 B2
(45) Date of Patent: Oct. 8, 2019

(54) TIME-INTERLEAVED SOURCE DRIVER FOR DISPLAY DEVICES

(71) Applicant: Apple Inc., Cupertino, CA (US)

(72) Inventors: Derek K. Shaeffer, Redwood City, CA (US); Jesse A. Richmond, San Francisco, CA (US); Kenichi Ueno, Tokyo (JP); Kingsuk Brahma, Mountain View, CA (US); Mohammad B. Vahid Far, San Jose, CA (US); Shingo Hatanaka, San Jose, CA (US); Yafei Bi, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 20 days.

(21) Appl. No.: 15/697,172

(22) Filed: Sep. 6, 2017

(65) Prior Publication Data

US 2018/0082638 A1 Mar. 22, 2018

Related U.S. Application Data

(60) Provisional application No. 62/397,838, filed on Sep. 21, 2016.

(51) Int. Cl.
*G09G 3/3258* (2016.01)
*G09G 3/36* (2006.01)
(Continued)

(52) U.S. Cl.
CPC ......... *G09G 3/3258* (2013.01); *G09G 3/2011* (2013.01); *G09G 3/3275* (2013.01);
(Continued)

(58) Field of Classification Search
CPC .. G09G 3/3258; G09G 3/2011; G09G 3/3233; G09G 3/3275; G09G 3/3283;
(Continued)

(56) References Cited

U.S. PATENT DOCUMENTS 6,191,720 B1 * 2/2001 Zhang .................. H03M 1/682 341/144
8,289,260 B2 10/2012 Kim et al.
(Continued)

OTHER PUBLICATIONS

International Partial Search Report for PCT Application No. PCT/US2017/050529 dated Nov. 10, 2017; 13 pgs.

*Primary Examiner* — Sardis F Azongha
(74) *Attorney, Agent, or Firm* — Fletcher Yoder P.C.

(57) ABSTRACT

A display device may include a plurality of pixels that display image data on a display, a digital-to-analog converter that outputs a voltage that corresponds to a luminance value to be depicted on a first pixel, and a circuit that amplifies the voltage and outputs an amplified voltage to the first pixel. The circuit may include a capacitor that receives the voltage via the digital-to-analog converter and an amplifier coupled to the capacitor. The amplifier generates the amplified voltage based on the voltage stored the capacitor. The circuit also include switches that couple a first terminal of the capacitor to an output of the amplifier during a first amount of time and couples a second terminal of the capacitor to the output of the amplifier after the first amount of time expires.

17 Claims, 10 Drawing Sheets

(51) Int. Cl.

| | |
|---|---|
| ***G09G 3/3233*** | (2016.01) |
| ***G09G 3/20*** | (2006.01) |
| ***H03M 1/66*** | (2006.01) |
| ***G09G 3/3275*** | (2016.01) |

(52) U.S. Cl.
CPC .......... *G09G 3/3233* (2013.01); *G09G 3/3688* (2013.01); *G09G 2310/027* (2013.01); *G09G 2310/0291* (2013.01); *G09G 2310/0294* (2013.01); *G09G 2310/0297* (2013.01); *G09G 2310/08* (2013.01); *G09G 2320/0276* (2013.01); *G09G 2330/021* (2013.01); *G09G 2330/028* (2013.01); *G09G 2340/0435* (2013.01)

(58) Field of Classification Search
CPC ........... G09G 3/3291; G09G 2310/027; G09G 2310/0272; G09G 3/006; H01L 27/3246; H01L 27/3248; H01L 27/3276; H01L 27/3258; H01L 27/3251; H01L 27/3253; H01L 51/5228
See application file for complete search history.

(56) References Cited

U.S. PATENT DOCUMENTS

| | | | | |
|---|---|---|---|---|
| 2008/0024478 A1* | 1/2008 | Yoshioka | G09G 3/3688 | 345/210 |
| 2008/0030489 A1 | 2/2008 | Kim et al. | | |
| 2009/0096818 A1* | 4/2009 | Nishimura | G09G 3/3291 | 345/690 |
| 2009/0278865 A1* | 11/2009 | Kang | G09G 3/3688 | 345/690 |
| 2011/0080214 A1* | 4/2011 | Tsuchi | G09G 3/3688 | 330/69 |
| 2016/0055803 A1 | 2/2016 | Kim et al. | | |
| 2016/0078805 A1 | 3/2016 | Woo et al. | | |
| 2016/0155380 A1 | 6/2016 | Kwon et al. | | |
| 2016/0163255 A1 | 6/2016 | Kim et al. | | |

* cited by examiner

TIME-INTERLEAVED SOURCE DRIVER FOR DISPLAY DEVICES

CROSS-REFERENCE TO RELATED APPLICATIONS

This application claims the benefit of U.S. Provisional Application No. 62/397,838 entitled "Time-Interleaved Source Driver For Display Devices" filed on Sep. 21, 2016, which is incorporated by reference herein its entirety for all purposes.

BACKGROUND

The present disclosure relates generally to electronic displays and, more particularly, to techniques to increase the refresh rate in electronic displays.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices include an electronic display that displays visual representations based on received image data. More specifically, the image data may indicate desired luminance (e.g., brightness) of a display pixel for displaying an image frame. For example, in an organic light emitting diode (OLED) display, the image data (e.g., pixel voltage data) may be input to and amplified by one or more amplifiers of a source driver circuit. The amplified pixel voltage may then be supplied the gate of a switching device (e.g., a thin film transistor) in a display pixel. Based on magnitude of the supplied voltage, the switching device may control magnitude of supply current flowing into a light-emitting component (e.g., OLED) of the display pixel.

Prior to receiving the image data, the source driver circuit may wait a certain amount of time to ensure that the proper voltage is received. That is, various circuit components (e.g., gamma circuit) may provide analog voltage signals to the source driver circuit. The amount of time that the source driver circuit may wait before receiving the image data may relate to a settling time of the analog voltage signal output by the gamma circuit. The delay due to the settling times of the various circuit components may inhibit the ability of the source driver circuit to quickly output image data to data lines used to provide respective image data to the display pixels. As a result, the refresh rate of a display device may be limited due to the settling times of various analog voltage signals received by the source driver circuit or other circuit components of the display device.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to electronic displays that display image frames to facilitate visually presenting information. Generally an electronic display displays an image frame by controlling luminance of its display pixels based at least in part on image data indicating desired luminance of the display pixels. For example, to facilitate displaying an image frame, an organic light emitting diode (OLED) display may receive image data, amplify the image data using one or more amplifiers, and supply amplified image data to display pixels. When activated, display pixels may apply the amplified image data to the gate of a switching device (e.g., thin-film transistor) to control magnitude of the supply current flowing through a light-emitting component (e.g., OLED). In this manner, since the luminance of OLED display pixels is based on supply current flowing through their light emitting components, the image frame may be displayed based at least in part on corresponding image data.

With this background in mind, and to address some of the issues mentioned above, the present techniques provide a system for operating an electronic display to reduce a dependence between settling times for analog voltage signals used to drive display pixels and an overall display refresh rate. Generally, an electronic display may include a gamma circuit that outputs an analog voltage signal that corresponds to image data to be depicted on a respective display pixel of the electronic display. The analog voltage signal provided by the gamma circuit is then supplied to a source driver (e.g., amplifier) that amplifies the analog voltage signal, such that the amplified analog voltage signal is provided to the respective pixel via a data line and pixel circuitry (e.g., a switching device).

Before amplifying the analog voltage signal received from the gamma circuit, the source driver may wait a certain amount of time ($t_{settle1}$) for the analog voltage signal output by the gamma circuit to settle to ensure that the settled analog voltage signal is amplified. In the same manner, the pixel circuitry (e.g., switching device) may wait another amount of time ($t_{settle2}$) to ensure that the amplified analog voltage signal output by the source driver has settled before applying the amplified voltage to the respective display pixel.

The total amount of time (e.g., line time) allotted for the pixel circuitry to drive a pixel is thus related to the gamma voltage settling time and the source driver voltage settling time. As such, the line time directly influences a maximum refresh rate that the electronic display may achieve without compromising the quality of the image data depicted by the display. That is, longer line times may inhibit ability of the display to achieve higher refresh rates.

With the foregoing in mind, to reduce the amount of time that the pixel circuitry may wait for various voltage signals to settle, the source driver may switch between two operation modes—namely a first operation mode during which a gamma voltage for one data line is stored in a capacitor prior to being output to the data line and a second operation mode during which the data line is driven using the voltage stored in the capacitor. As a result, the amount of time before the source drive supplies the gamma voltages to respective pixel circuitry may be reduced, thereby facilitating implementation of higher refresh rates.

To incorporate the two operation modes mentioned above, in one embodiment, the source driver may include two amplifier circuits, each of which has two inputs. One input of each amplifier circuit may be coupled to a respective capacitor, while the other input of each amplifier circuit may be coupled to a common mode voltage (Vcm).

Using this configuration, the source driver may use alternating phases of operations to drive a respective pixel. For instance, during a first phase of operation (e.g., sample phase), the gamma circuit may be coupled to a first capacitor while a respective first amplifier circuit may be disconnected from the pixel circuitry (e.g., data line) used for the illumination of the respective pixel. Accordingly, the first capacitor may charge based on the analog voltage output by the gamma circuit.

During the second phase of operation (e.g., drive phase), the gamma circuit may be disconnected from the first capacitor and the respective amplifier circuit may be coupled to the pixel circuitry. Since the first capacitor has been charged to the appropriate voltage, the respective first amplifier circuit does not wait for the analog voltage signal to settle before providing the amplified voltage to the pixel circuitry. In this manner, the settling time of the source driver may be decoupled from the setting time of the gamma circuit.

When the first amplifier circuit is connected to the pixel circuitry and the first capacitor is disconnected from the gamma circuit, the second amplifier circuit is disconnected from the pixel circuitry and the second capacitor is coupled to the gamma circuit. As such, the second amplifier circuit of the source driver is operating in a sample phase while the first amplifier circuit is operating in a drive phase. In other words, the first and second amplifier circuits operate in different phases with respect to each other, such that while one amplifier circuit drives the pixel circuitry, the capacitor associated with the other amplifier circuit is being charged to the analog voltage that will be used to drive the pixel circuitry in a subsequent frame of image data. By using this interleaved sampling and driving operation modes, the amount of time in which the source driver waits prior to driving respective pixel circuitry may be reduced. As a result, the source driver may operate more quickly (e.g., increase rate with which display pixels are written), which may enable the display device to achieve higher refresh rates.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
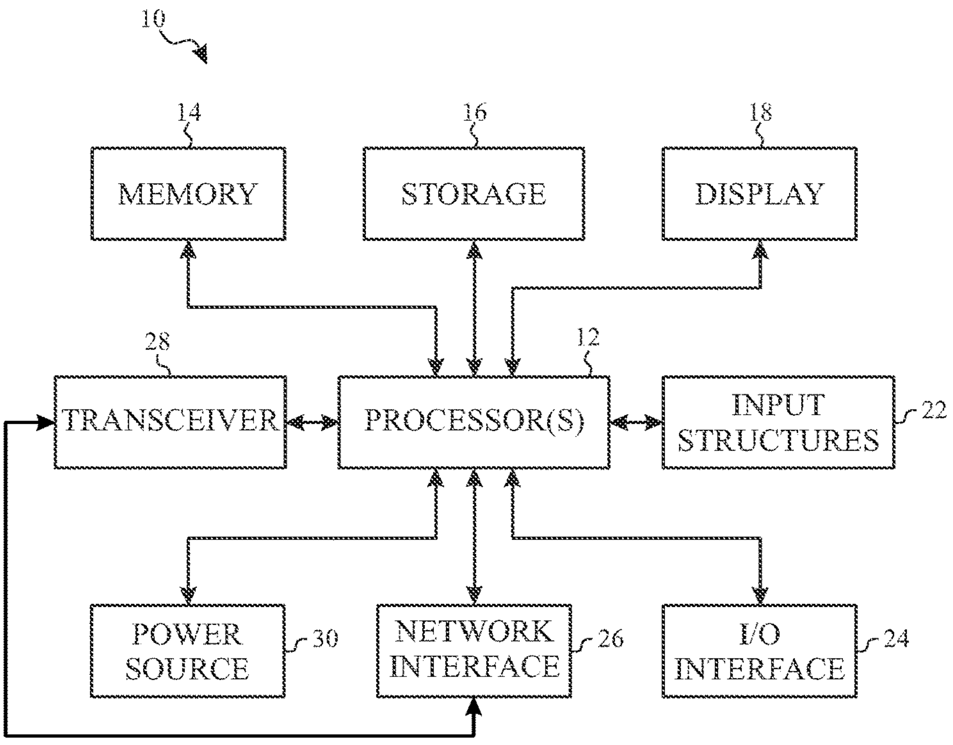
FIG. 1 is a schematic block diagram of an electronic device including an electronic display, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, embodiments of the present disclosure relate to decreasing an amount of time that a source driver or pixel circuitry waits to allow analog voltage signals output by a gamma circuit to settle. Generally, as the refresh rate for a display increases, the available time for settling the gamma voltage associated with a respective pixel reduces. As such, by reducing the amount of time that the source driver or pixel circuitry waits for signals to settle, the presently disclosed systems may enable electronic displays to display image frames using increased refresh rates.

Keeping the foregoing in mind, the present disclosure describes embodiments that reduce the settling time associated with providing a pixel voltage to a pixel via a gamma circuit and a source driver. In one embodiment, a pixel driving circuit may divide the operation related to providing the pixel voltage to a respective pixel into two phases using a switched capacitor approach with two banks of capacitors. That is, in one phase, the gamma voltage for a next line of the display is sampled and stored on a first capacitor, while the source driver is providing the voltage from a second capacitor onto the data lines. In the following phase, these two capacitors switch operations. As such, the first capacitor is connected to the source driver and the voltage stored on the first capacitor is provided onto the data line while the second capacitor samples the gamma voltage for the next data line in the display. Accordingly, the presently disclosed systems provide for an interleaving of sampling gamma voltage and driving pixels at the same time. By sampling the gamma voltage onto a capacitor and using the voltage stored on the capacitor to drive a respective pixel, the pixel circuitry avoids waiting for the gamma voltage to settle, as compared to receiving the gamma voltage directly from the gamma circuit at the source driver.

Moreover, the two-phase operation for driving pixels described briefly above offers a number of benefits to the operation of the display device. For instance, the two-phase operation scheme decouples the operation of sampling the gamma voltage and the separate operation of driving the voltage onto the data line. As a result, the display device is capable of increasing its refresh rate because the source driver is not limited by the settling time of the voltage output by the gamma circuit. In addition, the source driver itself is able to settle the voltage onto the data line more quickly because it already has its final value at its inputs, via the respective capacitor, as soon as the source driver is to output an amplified voltage onto the data line. As a result, the amplifier circuit of the source drier is pushing the settling as quickly as possible. Further, by employing the two-phase operation scheme, the gamma circuit is allotted an entire line time to allow for the output voltage to settle. In this way, the gamma circuit may scale down its power consumption.

With this in mind, source drivers have, in some instances, acted as a buffer that receives voltage from a gamma digital-to-analog converter (DAC) and drives the received voltage onto the display panel directly. In this case, voltages output by the gamma DAC and the source driver both settle during the same time period. As a result, the source driver lags behind the gamma DAC because the source driver waits for the voltage output by the gamma DAC to settle before amplifying the voltage output. In this way, the gamma DAC should be designed to settle faster than the overall settling time that the source driver waits before amplifying the voltage signal to ensure that a network of circuit components within the display has sufficient time to provide respective voltages to respective pixels. Additional details with regard to using two phases of operation to reduce the wait time for analog voltages to settle will be described below with reference to FIGS. 8-14.

By way of introduction, a general description of suitable electronic devices that may employ an electronic display will be provided below. Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, network interfaces 26, a transceiver 28, and a power source 30. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in electronic device 10.

Figure 2:
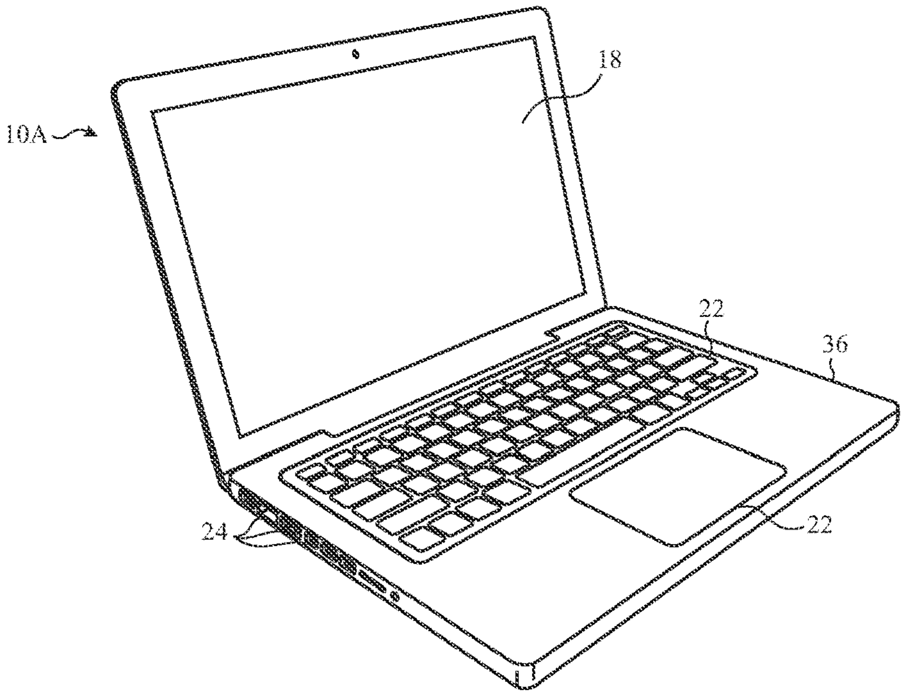
FIG. 2 is a perspective view of a notebook computer representing an embodiment of the electronic device of FIG. 1.
Figure 3:
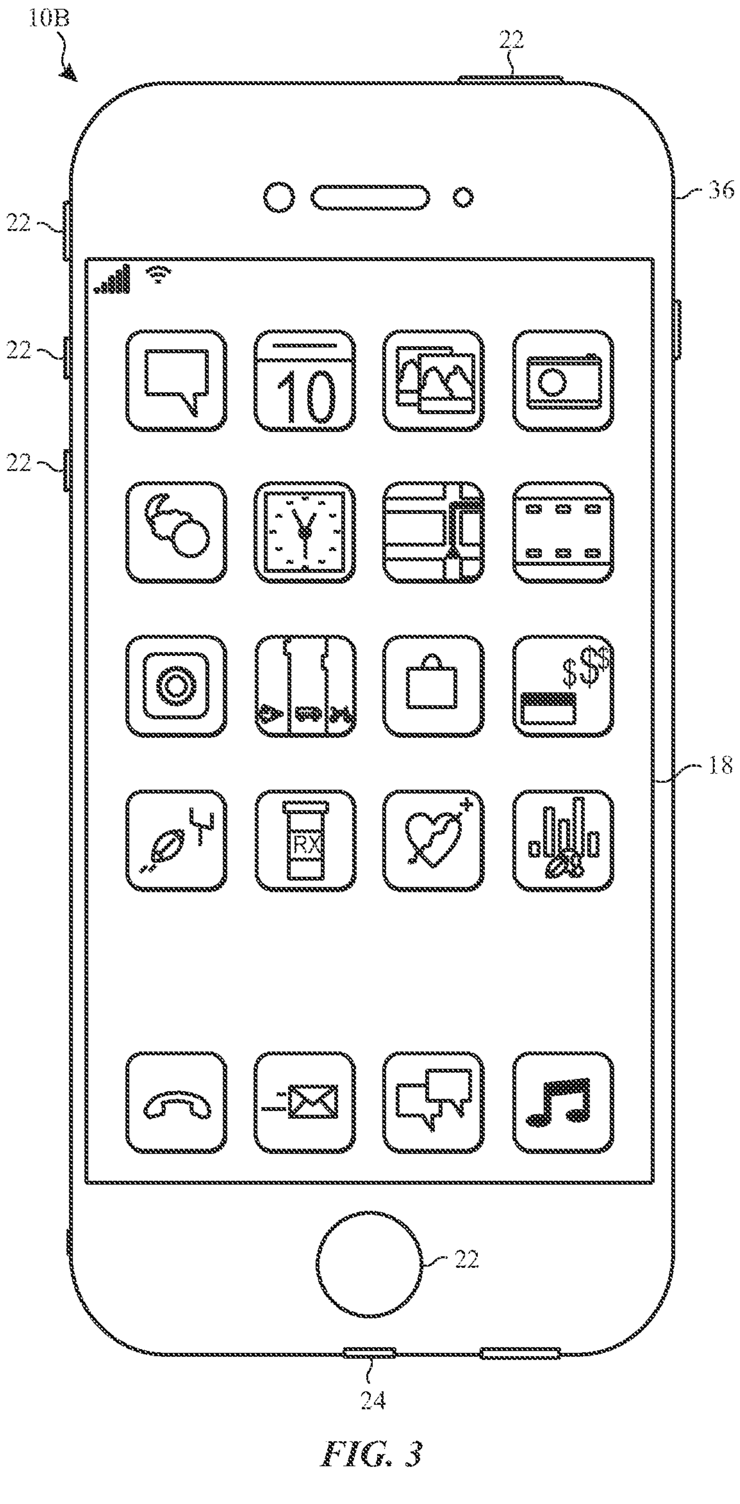
FIG. 3 is a front view of a hand-held device representing another embodiment of the electronic device of FIG. 1.
Figure 4:
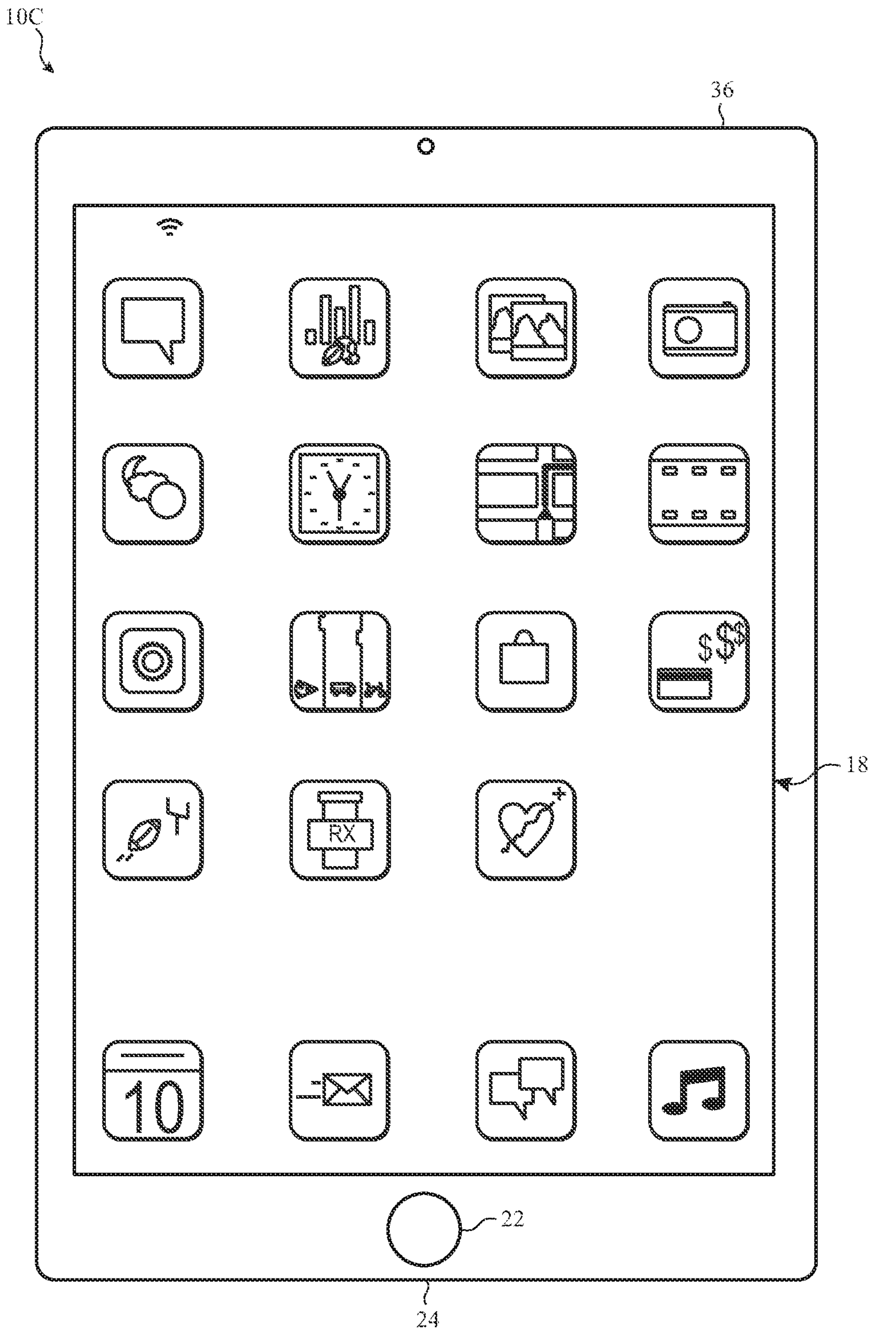
FIG. 4 is a front view of another hand-held device representing another embodiment of the electronic device of FIG. 1.
Figure 5:
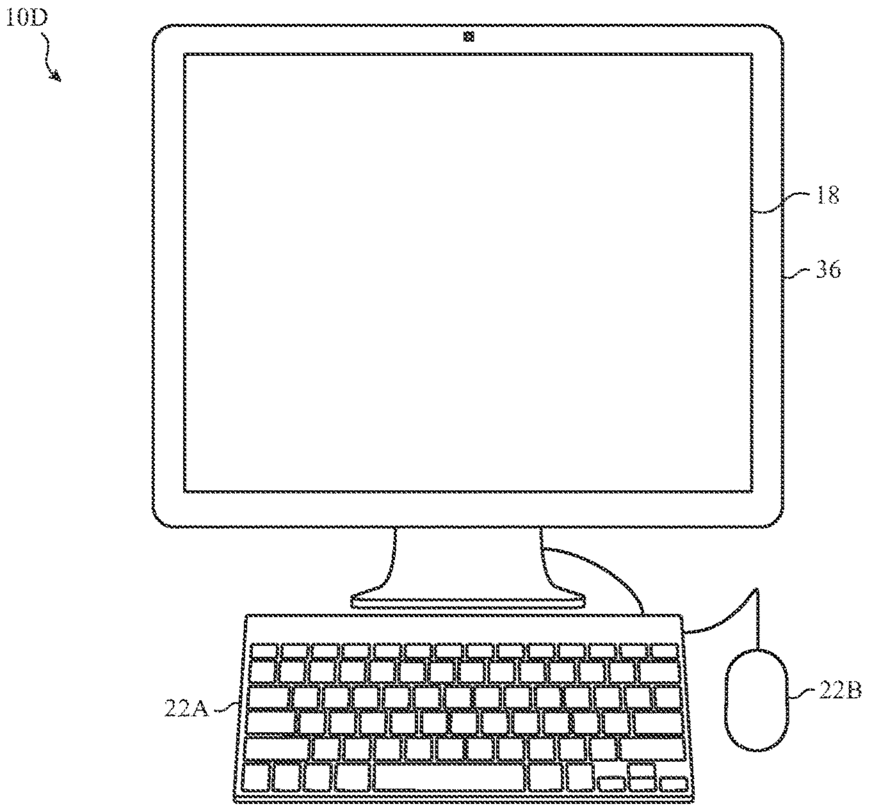
FIG. 5 is a front view of a desktop computer representing another embodiment of the electronic device of FIG. 1.
Figure 6:
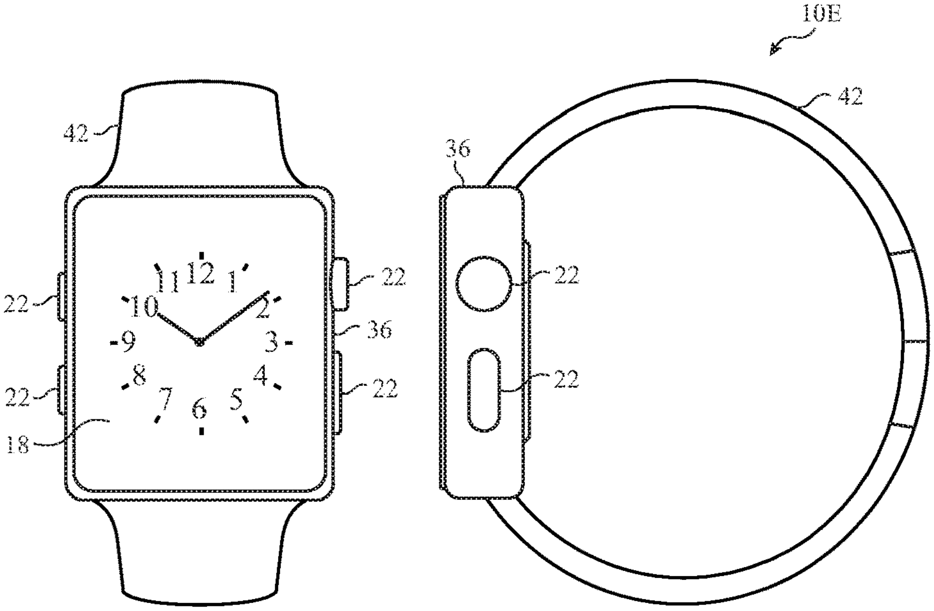
FIG. 6 is a front view and side view of a wearable electronic device representing another embodiment of the electronic device of FIG. 1.

By way of example, the electronic device 10 may represent a block diagram of the notebook computer depicted in FIG. 2, the handheld device depicted in FIG. 3, the handheld device depicted in FIG. 4, the desktop computer depicted in FIG. 5, the wearable electronic device depicted in FIG. 6, or similar devices. It should be noted that the processor(s) 12 and/or other data processing circuitry may be generally referred to herein as "data processing circuitry." Such data processing circuitry may be embodied wholly or in part as software, firmware, hardware, or any combination thereof. Furthermore, the data processing circuitry may be a single contained processing module or may be incorporated wholly or partially within any of the other elements within the electronic device 10.

In the electronic device 10 of FIG. 1, the processor(s) 12 and/or other data processing circuitry may be operably coupled with the memory 14 and the nonvolatile storage 16 to perform various algorithms. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may also include instructions that may be executed by the processor(s) 12 to enable the electronic device 10 to provide various functionalities.

In certain embodiments, the display 18 may be an active-matrix organic light emitting diode (AMOLED) display, which may allow users to view images generated on the electronic device 10. In some embodiments, the display 18 may include a touch screen, which may allow users to interact with a user interface of the electronic device 10. Furthermore, it should be appreciated that, in some embodiments, the display 18 may include one or more organic light emitting diode (OLED) displays, or some combination of LCD panels and OLED panels.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN) or wireless local area network (WLAN), such as an 802.11x Wi-Fi network, and/or for a wide area network (WAN), such as a 3$^{rd}$ generation (3G) cellular network, 4$^{th}$ generation (4G) cellular network, long term evolution (LTE) cellular network, or long term evolution license assisted access (LTE-LAA) cellular network. The network interface 26 may also include interfaces for, for example, broadband fixed wireless access networks (WiMAX), mobile broadband Wireless networks (mobile WiMAX), asynchronous digital subscriber lines (e.g., ADSL, VDSL), digital video broadcasting-terrestrial (DVB-T) and its extension DVB Handheld (DVB-H), ultra Wideband (UWB), alternating current (AC) power lines, and so forth.

In certain embodiments, to allow the electronic device 10 to communicate over the aforementioned wireless networks (e.g., Wi-Fi, WiMAX, mobile WiMAX, 4G, LTE, and so forth), the electronic device 10 may include a transceiver 28. The transceiver 28 may include any circuitry the may be useful in both wirelessly receiving and wirelessly transmitting signals (e.g., data signals). Indeed, in some embodiments, as will be further appreciated, the transceiver 28 may include a transmitter and a receiver combined into a single unit, or, in other embodiments, the transceiver 28 may include a transmitter separate from the receiver. For example, the transceiver 28 may transmit and receive OFDM signals (e.g., OFDM data symbols) to support data communication in wireless applications such as, for example, PAN networks (e.g., Bluetooth), WLAN networks (e.g., 802.11x Wi-Fi), WAN networks (e.g., 3G, 4G, and LTE and LTE-LAA cellular networks), WiMAX networks, mobile WiMAX networks, ADSL and VDSL networks, DVB-T and DVB-H networks, UWB networks, and so forth. As further illustrated, the electronic device 10 may include a power source 29. The power source 29 may include any suitable source of power, such as a rechargeable lithium polymer (Li-poly) battery and/or an alternating current (AC) power converter.

In certain embodiments, the electronic device 10 may take the form of a computer, a portable electronic device, a wearable electronic device, or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 10A, is illustrated in FIG. 2 in accordance with one embodiment of the present disclosure. The depicted computer 10A may include a housing or enclosure 36, a display 18, input structures 22, and ports of an I/O interface 24. In one embodiment, the input structures 22 (such as a keyboard and/or touchpad) may be used to interact with the computer 10A, such as to start, control, or operate a GUI or applications running on computer 10A. For example, a keyboard and/or touchpad may allow a user to navigate a user interface or application interface displayed on display 18.

FIG. 3 depicts a front view of a handheld device 10B, which represents one embodiment of the electronic device 10. The handheld device 10B may represent, for example, a portable phone, a media player, a personal data organizer, a handheld game platform, or any combination of such devices. By way of example, the handheld device 10B may be a model of an iPod® or iPhone® available from Apple Inc. of Cupertino, Calif. The handheld device 10B may include an enclosure 36 to protect interior components from physical damage and to shield them from electromagnetic interference. The enclosure 36 may surround the display 18. The I/O interfaces 24 may open through the enclosure 36 and may include, for example, an I/O port for a hard wired connection for charging and/or content manipulation using a standard connector and protocol, such as the Lightning connector provided by Apple Inc., a universal service bus (USB), or other similar connector and protocol.

User input structures 22, in combination with the display 18, may allow a user to control the handheld device 10B. For example, the input structures 22 may activate or deactivate the handheld device 10B, navigate user interface to a home screen, a user-configurable application screen, and/or activate a voice-recognition feature of the handheld device 10B. Other input structures 22 may provide volume control, or may toggle between vibrate and ring modes. The input structures 22 may also include a microphone may obtain a user's voice for various voice-related features, and a speaker may enable audio playback and/or certain phone capabilities. The input structures 22 may also include a headphone input may provide a connection to external speakers and/or headphones.

FIG. 4 depicts a front view of another handheld device 10C, which represents another embodiment of the electronic device 10. The handheld device 10C may represent, for example, a tablet computer, or one of various portable computing devices. By way of example, the handheld device 10C may be a tablet-sized embodiment of the electronic device 10, which may be, for example, a model of an iPad® available from Apple Inc. of Cupertino, Calif.

Turning to FIG. 5, a computer 10D may represent another embodiment of the electronic device 10 of FIG. 1. The computer 10D may be any computer, such as a desktop computer, a server, or a notebook computer, but may also be a standalone media player or video gaming machine. By way of example, the computer 10D may be an iMac®, a MacBook®, or other similar device by Apple Inc. It should be noted that the computer 10D may also represent a personal computer (PC) by another manufacturer. A similar enclosure 36 may be provided to protect and enclose internal components of the computer 10D such as the display 18. In certain embodiments, a user of the computer 10D may interact with the computer 10D using various peripheral input devices, such as the keyboard 22A or mouse 22B (e.g., input structures 22), which may connect to the computer 10D.

Similarly, FIG. 6 depicts a wearable electronic device 10E representing another embodiment of the electronic device 10 of FIG. 1 that may be configured to operate using the techniques described herein. By way of example, the wearable electronic device 10E, which may include a wristband 42, may be an Apple Watch® by Apple, Inc. However, in other embodiments, the wearable electronic device 10E may include any wearable electronic device such as, for example, a wearable exercise monitoring device (e.g., pedometer, accelerometer, heart rate monitor), or other device by another manufacturer. The display 18 of the wearable electronic device 10E may include a touch screen display 18 (e.g., LCD, OLED display, active-matrix organic light emitting diode (AMOLED) display, and so forth), as well as input structures 22, which may allow users to interact with a user interface of the wearable electronic device 10E.

As described above, the computing device 10 may include an electronic display 12 to facilitate presenting visual representations to one or more users. Accordingly, the electronic display 12 may be any one of various suitable types. For example, in some embodiments, the electronic display 12 may be an LCD display while, in other embodiments, the display may be an OLED display, such as an AMOLED display or a PMOLED display. Although operation may vary, some operational principles of different types of electronic displays 12 may be similar. For example, electronic displays 12 may generally display image frames by controlling luminance of their display pixels based on received image data.

Figure 7:
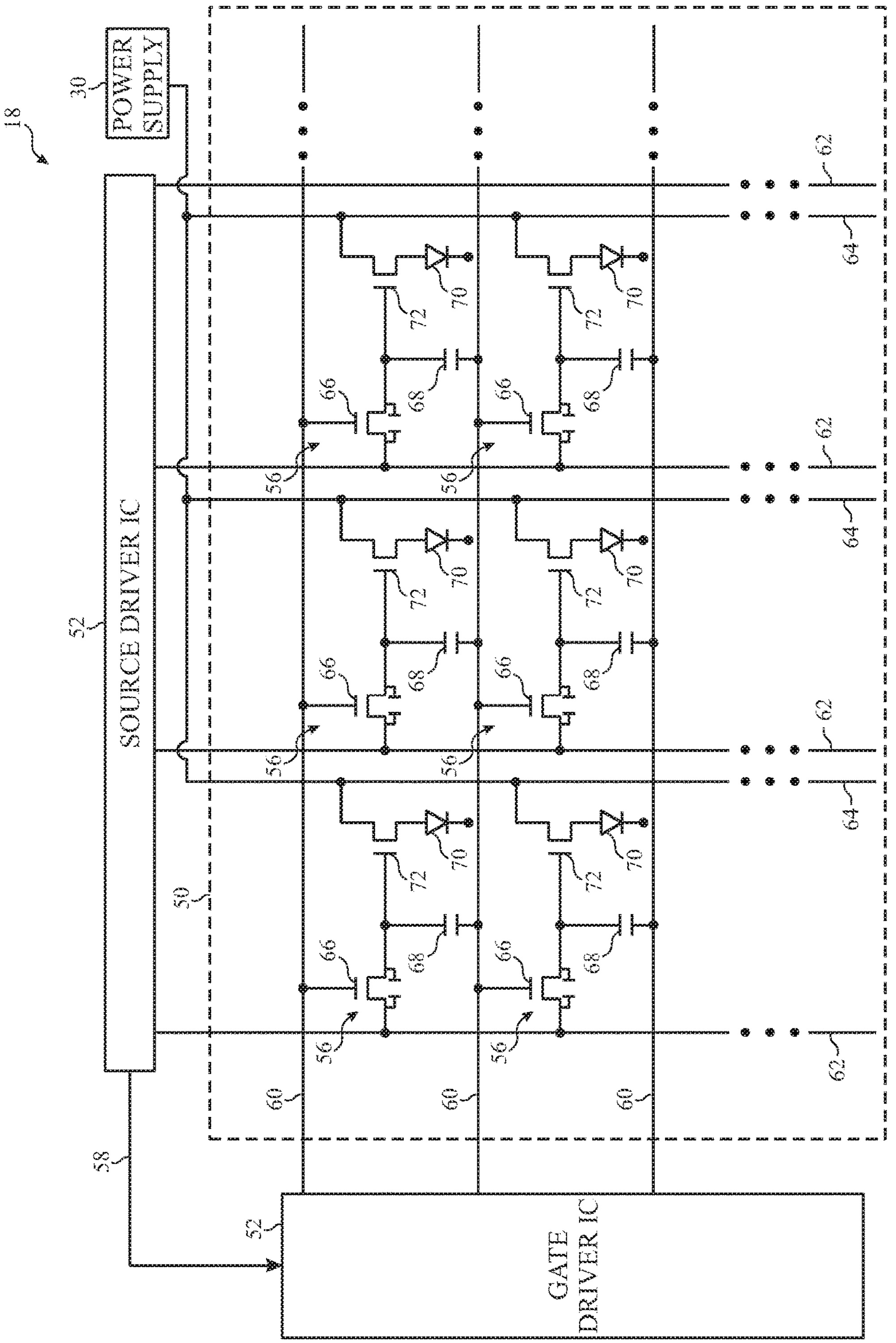
FIG. 7 illustrates a schematic diagram of an organic light emitting diode (OLED) electronic display, in accordance with at least one embodiment.

To help illustrate, one embodiment of an OLED display 18 is described in FIG. 7. As depicted, the OLED display 18 includes a display panel 50, a source driver 52, a gate driver 54, and a power supply 30. Additionally, the display panel 50 may include multiple display pixels 56 arranged as an array or matrix defining multiple rows and columns. For example, the depicted embodiment includes a six display pixels 56. It should be appreciated that although only six display pixels 56 are depicted, in an actual implementation the display panel 50 may include hundreds or even thousands of display pixels 56.

As described above, an electronic display 18 may display image frames by controlling luminance of its display pixels 56 based at least in part on received image data. To facilitate displaying an image frame, a timing controller may determine and transmit timing data on line 58 to the gate driver 54 based at least in part on the image data. For example, in the depicted embodiment, the timing controller may be included in the source driver 52. Accordingly, in such embodiments, the source driver 52 may receive image data that indicates desired luminance of one or more display pixels 56 for displaying the image frame, analyze the image data to determine the timing data based at least in part on what display pixels 56 the image data corresponds to, and transmit the timing data to the gate driver 54. Based at least in part on the timing data, the gate driver 54 may then transmit gate activation signals to activate a row of display pixels 56 via gate lines 60.

When activated, luminance of a display pixel 56 may be adjusted by amplified image data received via data lines 62. In some embodiments, the source driver 52 may generate the amplified image data by receiving the image data and amplifying voltage of the image data. The source driver 52 may then supply the amplified image data to the activated pixels. Thus, as depicted, each display pixel 56 may be located at an intersection of a gate line 60 (e.g., scan line) and a data line 62 (e.g., source line). Based on received amplified image data, the display pixel 56 may adjust its luminance using electrical power supplied from the power supply 29 via power supply lines 64.

As depicted, each display pixel 56 includes a circuit switching thin-film transistor (TFT) 66, a storage capacitor 68, an OLED 70, and a driving TFT 72. To facilitate adjusting luminance, the driving TFT 72 and the circuit switching TFT 66 may each serve as a switching device that is controllably turned on and off by voltage applied to its gate. In the depicted embodiment, the gate of the circuit switching TFT 66 is electrically coupled to a gate line 60. Accordingly, when a gate activation signal received from its gate line 60 is above its threshold voltage, the circuit switching TFT 66 may turn on, thereby activating the display pixel 56 and charging the storage capacitor 68 with amplified image data received at its data line 62.

Additionally, in the depicted embodiment, the gate of the driving TFT 72 is electrically coupled to the storage capacitor 68. As such, voltage of the storage capacitor 68 may control operation of the driving TFT 72. More specifically, in some embodiments, the driving TFT 72 may be operated in an active region to control magnitude of supply current flowing from the power supply line 64 through the OLED 70. In other words, as gate voltage (e.g., storage capacitor 68 voltage) increases above its threshold voltage, the driving TFT 72 may increase the amount of its channel available to conduct electrical power, thereby increasing supply current flowing to the OLED 70. On the other hand, as the gate voltage decreases while still being above its threshold voltage, the driving TFT 72 may decrease amount of its channel available to conduct electrical power, thereby decreasing supply current flowing to the OLED 70. In this manner, the OLED display 18 may control luminance of the display pixel 56. The OLED display 18 may similarly control luminance of other display pixels 56 to display an image frame.

As described above, image data may include a voltage indicating desired luminance of one or more display pixels 56. Accordingly, operation of the one or more display pixels 56 to control luminance should be based at least in part on the image data. In the OLED display 18, a driving TFT 72 may facilitate controlling luminance of a display pixel 56 by controlling magnitude of supply current flowing into its OLED 70. Additionally, the magnitude of supply current flowing into the OLED 70 may be controlled based at least in part on voltage supplied by a data line 60, which is used to charge the storage capacitor 68. However, since image data may be received from an image source, magnitude of the image data may be relatively small. Accordingly, to facilitate controlling magnitude of supply current, the source driver 52 may include one or more amplifiers (e.g., buffers) that amplify the image data to generate amplified image data with a voltage sufficient to control operation of the driving TFTs 72 in their active regions.

Figure 8:
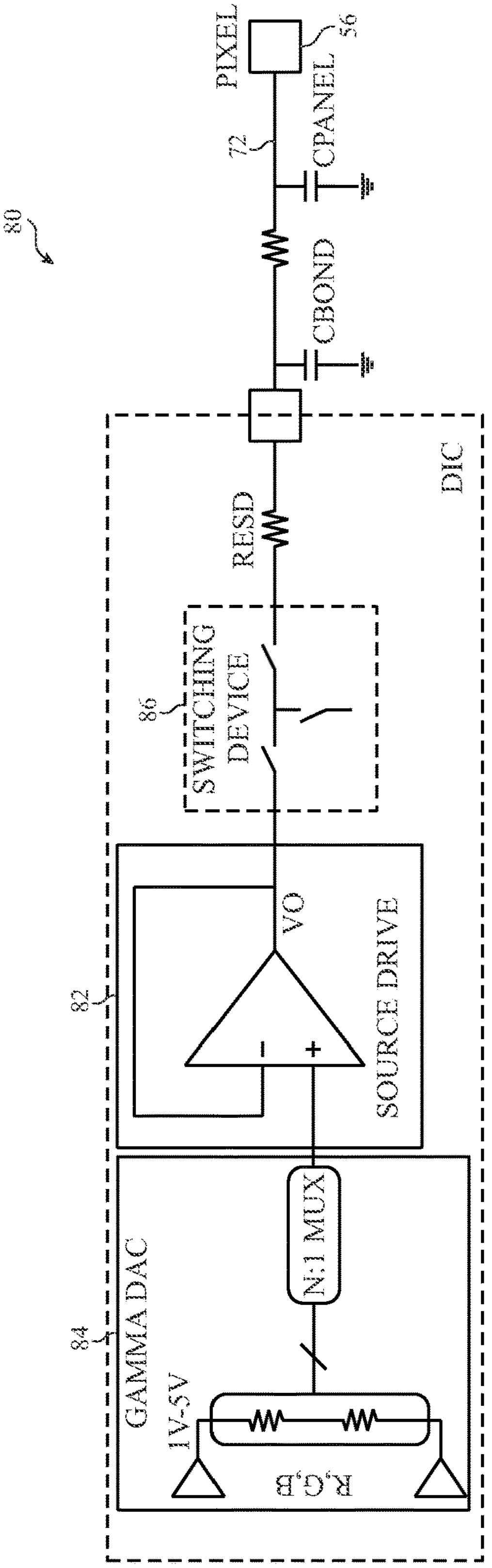
FIG. 8 illustrates a schematic diagram of circuit components that are coupled to a source driver of the electronic display of FIG. 7, in accordance with at least one embodiment.

With the foregoing in mind, FIG. 8 illustrates a schematic diagram 80 of circuit components that are coupled to a source driver 82. The source driver 82 may be part of the source driver 52 described above but may drive a single data line 62. Referring to FIG. 8, the source driver 82 may receive an analog voltage signal representative of pixel data to be provided to a pixel 56 via a gamma digital-to-analog converter (DAC) 84. The gamma DAC 84 may include a resistor ladder or string that is used to provide an analog voltage signal that represents a digital gray level value to be depicted by the display pixel 56. When the analog voltage signal is output by the gamma DAC 84, the signals takes a certain amount of time to settle. As such, the source driver 56 waits an amount of time before receiving the analog voltage to ensure that the signal has settled.

After receiving the analog voltage signal, the source driver 82 amplifies the analog voltage signal as described above. Like the analog signal output by the gamma DAC 84, the amplified analog voltage signal output by the source driver 52 may take some time to settle. As such, a switching device 86 may wait a certain amount of time before coupling the amplified analog voltage signal to a data line 62 and pixel 56. Due to the settling times associated with the outputs of the gamma DAC 84 and the source driver 82, while the display 18 is continuously displaying data according to a refresh rate, the settling of the analog voltage signal and the amplified analog voltage signal takes place together. However, since the output of the gamma DAC 84 is the input to the source driver 82, the output of the source driver 82 lags behind the output of the gamma DAC 84.

Given the schematic diagram 80 of FIG. 8, to ensure that an accurate analog voltage signal is used to drive the pixel 56, the analog voltage signal output by the gamma DAC 84 should settle faster than a line time (e.g., amount of time that source driver 82 to provide voltages across one line of pixels 56 in panel 50). However, the settling time of the analog voltage signals is limited by the types of resistors used in the gamma DAC 82. That is, smaller-sized resistors in the gamma DAC 84 may improve the settling time characteristics of the analog voltage as compared to larger-sized resistors. However, using smaller-sized resistors may increase an amount of power consumed by the gamma DAC 84 as compared to using larger-sized resistors. To employ larger-sized resistors in the gamma DAC 84 and reduce the amount of power consumed by the gamma DAC 84, the time made available for the source driver 82 to wait for the analog voltage signal to settle should be longer as compared to when smaller-sized resistors are used in the gamma DAC 84.

In sum, to provide accurate amplified analog voltage signals to pixels 56 using the circuit components of the schematic diagram 80, the sizing of the resistors employed in the gamma DAC 84 is determined based on a balance of settling times for the different voltage signals and power consumption properties of the gamma DAC 84. Since slower settling times of the various voltage signals limit the possible refresh rate and resolution of the panel 50, it would be useful to decrease the amount of time that the source driver 82 waits for an analog voltage signal output by the gamma DAC 84 to settle, such that the panel 50 may achieve higher refresh rates and/or resolution.

Figure 9:
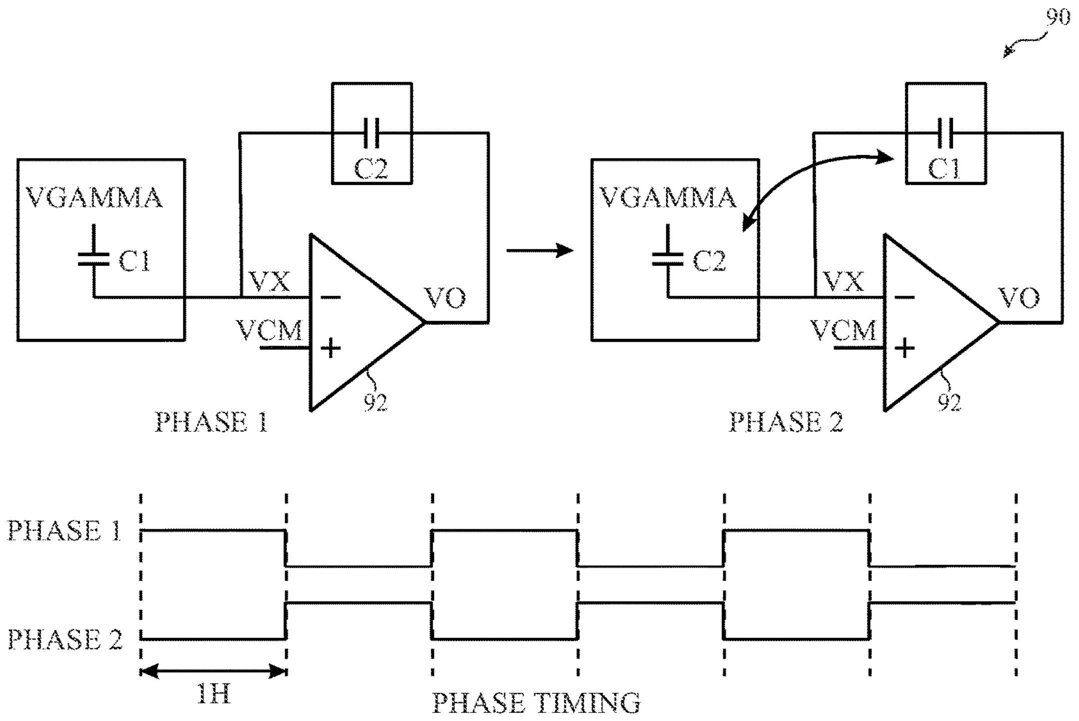
FIG. 9 illustrates a conceptual flow diagram that depicts two phases of operation for the source driver of the electronic display of FIG. 7, in accordance with at least one embodiment.

Keeping the foregoing in mind, to reduce the amount of time that the source driver 82 waits for the analog signal to settle, FIG. 9 illustrates a conceptual flow diagram 90 that depicts two phases of operation for the source driver 82. In particular, the conceptual flow diagram 90 illustrates connecting certain circuit components (e.g., capacitor) to the source driver 82 during two separate phases (e.g., modes) of operation to reduce the amount of time that the source driver 82 may wait to ensure that the analog voltage signal has settled. For instance, referring to FIG. 9, the analog voltage signal provided via the gamma DAC 84 may be coupled to a first capacitor C1 during a first phase of operation (e.g., phase 1) that corresponds to a first amount of time (e.g., line time). After the first amount of time expires and the first capacitor C1 is charged to the analog voltage value output by the gamma DAC 84, during a second phase of operation (e.g., phase 2), the first capacitor C1 may then be placed across an inverting terminal of an amplifier 92 of the source driver 82 and a second capacitor C2 may be coupled to the gamma DAC 84. As such, during the second phase of operation of the source driver 82, the amplifier 92 may drive the data line 62 and pixel 56 using the voltage stored in the capacitor C1. When the voltage is stored in the first capacitor C1 before the source driver 82 is called to drive the data line 62, the analog voltage stored in the first capacitor C1 has settled. In this way, the source driver 82 reduces the amount of time that it waits for the analog voltage signal to settle, as compared to being directly coupled to the gamma DAC 84 as provided in FIG. 8.

While the first capacitor C1 is providing the analog voltage signal to the amplifier 92 for a particular data line 62 during the second phase of operation, the second capacitor C2 is coupled to the gamma DAC 84 and is being charged for a subsequent pixel 56, for example, along the same data line 62 or the same gate line 60. According to the two-phase operation scheme described above, the analog voltage signal output by the gamma DAC 84 is afforded an amount of time that corresponds to an entire line time to settle. As a result, larger-sized resistors may be employed in the gamma DAC 84 to reduce power consumption.

Moreover, by employing the two-phase operation scheme depicted in FIG. 9, a full line time is also available for the source driver 82 to drive a pixel 56. Additionally, the amplifier 92 may use a fixed common mode voltage level (Vcm) and may directly transfer charge from a capacitor to the pixel 56. Furthermore, in certain embodiments, using the two-phase operation scheme allows the amplifier 92 to zero or remove an input stage offset that may be applied to the analog voltage due to the properties of the amplifier 92. That is, the amplifier 92 may include offset characteristics that may be applied to the input analog voltage signal and remain a part of the amplified analog voltage signal output by the amplifier 92. The offset of the amplifier 92 may drift or be affected by various environmental conditions, such as temperature.

Figure 10:
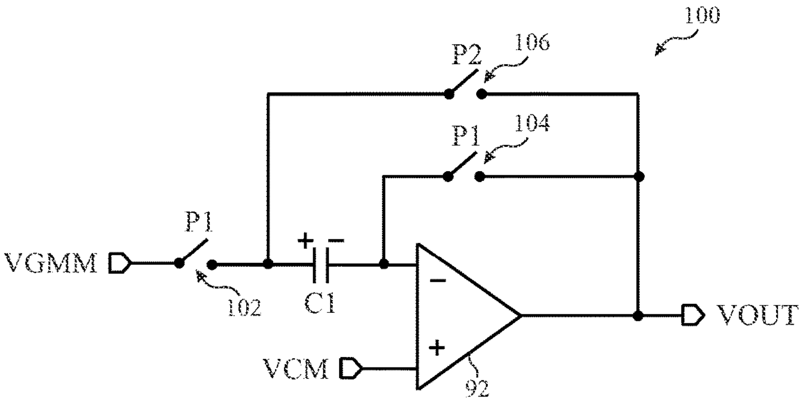
FIG. 10 illustrates a circuit diagram that compensates for an offset of an amplifier within the source driver of the electronic display of FIG. 7, in accordance with at least one embodiment.

To reduce the affects of the offset of the amplifier 92 on the amplified voltage output by the amplifier 92, FIG. 10 illustrates a circuit diagram 100 that compensates for the offset of the amplifier 92 in accordance with embodiments presented herein. As shown in FIG. 10, the amplifier 92 may be coupled to a capacitor (e.g., C1) via an inverting terminal of the amplifier 92. The capacitor C1 may also be coupled to the output (Vgmm) of the gamma DAC 84 via a switch 102.

As illustrated in FIG. 10, the capacitor C1 may also be coupled to the output terminal of the amplifier 92 via switch 104 at a node that is coupled to the inverting terminal of the amplifier 92. Switches 102 and 104 may operate (e.g., open and close) based on the whether the amplifier 92 is in a sampling phase (e.g., charging capacitor) or driving phase (e.g., providing voltage to pixel 56) as described above. That is, the switches 102 and 104 may both open and close at the same times, for example, according to a phase 1 (P1) signal supplied by a timing controller (TCON) in the display 18.

A third switch 106 may be coupled to a separate terminal of the capacitor C1 as compared to the switch 104. The switch 106 may also couple the capacitor C1 to the output (Vout) of the amplifier 92 when closed. That is, the switch 106 may both open and close, for example, according to a phase 2 (P2) signal supplied by a timing controller (TCON) in the display 18. It should be noted that the switches described herein with respect to FIGS. 10-14 may be controlled or operated via a timing controller or other suitable processor device that may be part of the source driver 52 or the like. In addition, it should also be noted that the switches described with respect FIGS. 10-14 may be any suitable type of switching device, such as transistors, semi-conductor devices, and the like.

Figure 11:
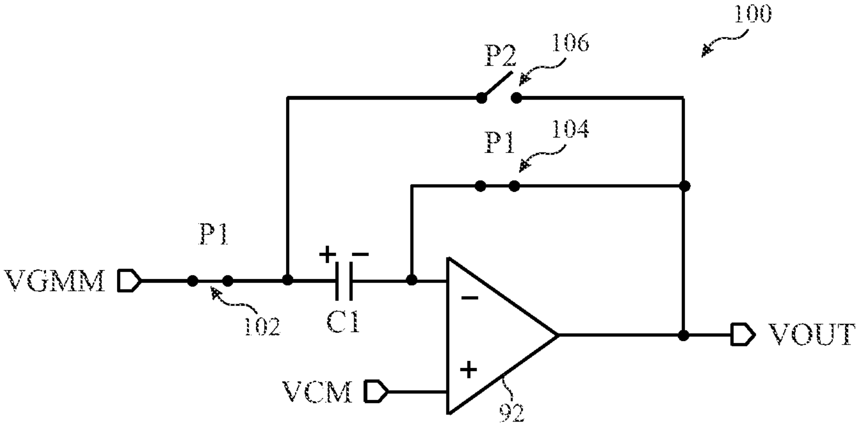
FIG. 11 illustrates a first phase of operation for operating the amplifier of FIG. 10, in accordance with at least one embodiment.

With the circuit diagram 100 in mind, FIG. 11 illustrates a first phase of operation for operating the amplifier 92 of FIG. 10 in accordance with the sampling phase. That is, when sampling the analog voltage signal output by the gamma DAC 84, the switches 102 and 104 are closed and the switch 106 is opened. As such, the capacitor C1 is charged to a desired analog voltage value that corresponds to pixel data to be provided to a respective pixel 56 via a data line 62.

During this phase of operation, the output (Vout) of the amplifier 92 is independent of the offset of the amplifier 92. Since the output (Vout) of the amplifier 92 is coupled to the capacitor C1, which is coupled to the output of the gamma DAC 84, and to the inverting terminal of the amplifier. The output (Vout) of the amplifier may be characterized as follows:

$$V\text{out}=Vcm+V\text{offset} \quad (1)$$

In Equation 1, Vcm corresponds to the common mode voltage and Voffset corresponds to the offset voltage of the amplifier. Using the equation above regard the output voltage (Vout), the voltage (Vcap) of the capacitor C1 may be characterized as:

$$V\text{cap}=Vgmm-V\text{out}=Vgmm-(Vcm+V\text{offset}) \quad (2)$$

Figure 12:
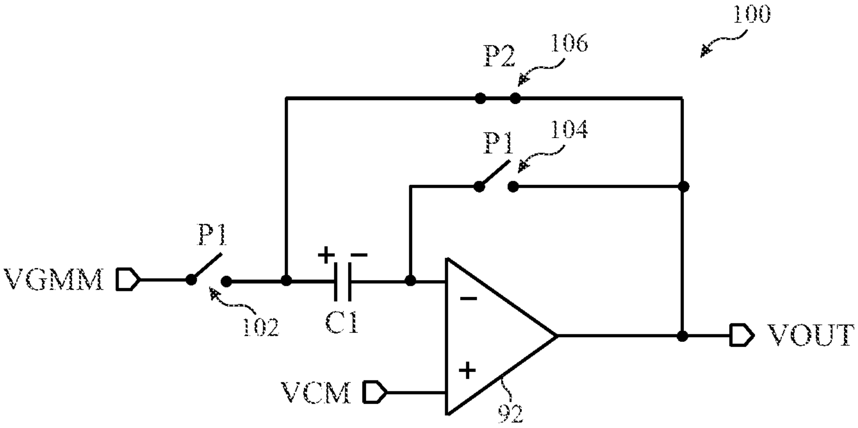
FIG. 12 illustrates a second phase of operation for operating the amplifier of FIG. 10, in accordance with at least one embodiment.

In Equation 2, Vgmm corresponds to the analog voltage signal output by the gamma DAC 84. After charging the capacitor C1 during the sampling phase, the switches 102 and 104 are opened and the switch 106 is closed during a drive (e.g., hold) phase as shown in FIG. 12. As such, the capacitor C1 is disconnected from the gamma DAC 84 and the output of the amplifier 92 is coupled to the capacitor C1. As a result, the output voltage (Vout) of the amplifier is characterized as:

$$Vout=Vcm+Voffset-(-Vcap) \quad (3)$$

Since the capacitor C1 has been charged during the sampling phase and the voltage (Vcap) corresponds to Equation 2, the output voltage (Vout) of the amplifier is also characterized as:

$$Vout=Vcm+Voffset-(-(Vgmm-(Vcm+Voffset)))$$

$$Vout=Vcm+Voffset+Vgmm-Vcm-Voffset$$

$$Vout=Vgmm \quad (4)$$

As such, by operating in the two-phase operation scheme depicted in FIGS. 11 and 12, the output voltage (Vout) of the amplifier 92 removes or reduces the offset properties (e.g., Voffset) present in the output voltage (Vout) of the amplifier 92. In this way, the effect of the offset properties of the amplifier 92 on the amplified analog voltage signal (Vout) provided to the data line 62 and the pixel 56 may be reduced.

Although the two-phase operation scheme depicted in FIGS. 11 and 12 may automatically remove the offset properties of the amplifier 92, in some cases, the capacitor C1 may store noise that can corrupt the output voltage (Vout) and the switch 104 may store some charge due to a respective control voltage used to open and/or close the switch 104. With this in mind, FIG. 13 illustrates a circuit diagram 110 that provides a balanced architecture to cancel charges that may be present on the output voltage (Vout) due to charges present (e.g., injected) on the switch 104 and the capacitor C1.

Figure 13:
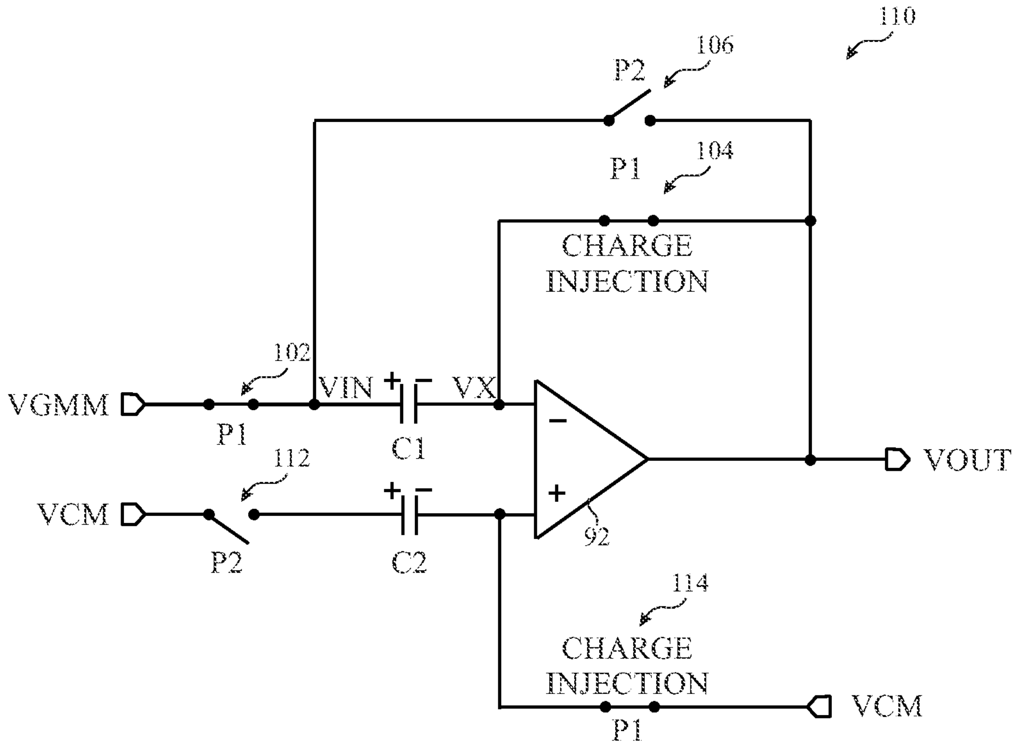
FIG. 13 illustrates a circuit diagram that provides a balanced architecture to cancel charges that may be present on a voltage output by the amplifier of FIG. 10 due to charges present on various switches and capacitors, in accordance with at least one embodiment.

Referring to FIG. 13, the non-inverting terminal of the amplifier 92 may be coupled to a second capacitor C2, which may be coupled to the common mode voltage (Vcm) via a switch 112 at one terminal of the second capacitor C2. In addition to these components, a switch 114 may be coupled to the other terminal of the second capacitor C2 and to the common mode voltage (Vcm). In operation, prior to operating in a sampling mode, the second capacitor C2 may be coupled to the common mode voltage (Vcm) via the switch 112 and may be charged to the common mode voltage (Vcm). At the same time, switches 102, 104, and 114 may be open. When the source driver 82 subsequently operates in the sampling mode, the switches 102 and 104 are closed and the switches 106 and 112 are opened, as illustrated in FIG. 13. As such, the voltage across the second capacitor C2 may be zero due to the common mode voltage (Vcm) connected to second capacitor C2 via the switch 114. However, since the common mode voltage (Vcm) is still coupled to the non-inverting terminal of the amplifier 92 via the switch 114, the stored charge of the switch 114 may be input into the non-inverting terminal of the amplifier 92. In the same manner, since the output voltage (Vout) is fed back to the inverting terminal of the amplifier 92 via the switch 104, the stored charge of the switch 104 is canceled by the stored charge of the switch 114 via the operation of the amplifier 92.

Additionally, since the voltage across the capacitor C2 should be canceled by the connection to the common mode voltage via the switch 114, the resultant noise of the second capacitor C2, which may be sized similar to the first capacitor C2, may remain on the second capacitor C2. This noise may be input into the non-inverting terminal of the amplifier 92 while the noise related to the first capacitor C1 may be input to the inverting terminal of the amplifier 92. As a result, the noise due to the first and second capacitors C1 and C2 may also be canceled via the amplifier 92.

Figure 14:
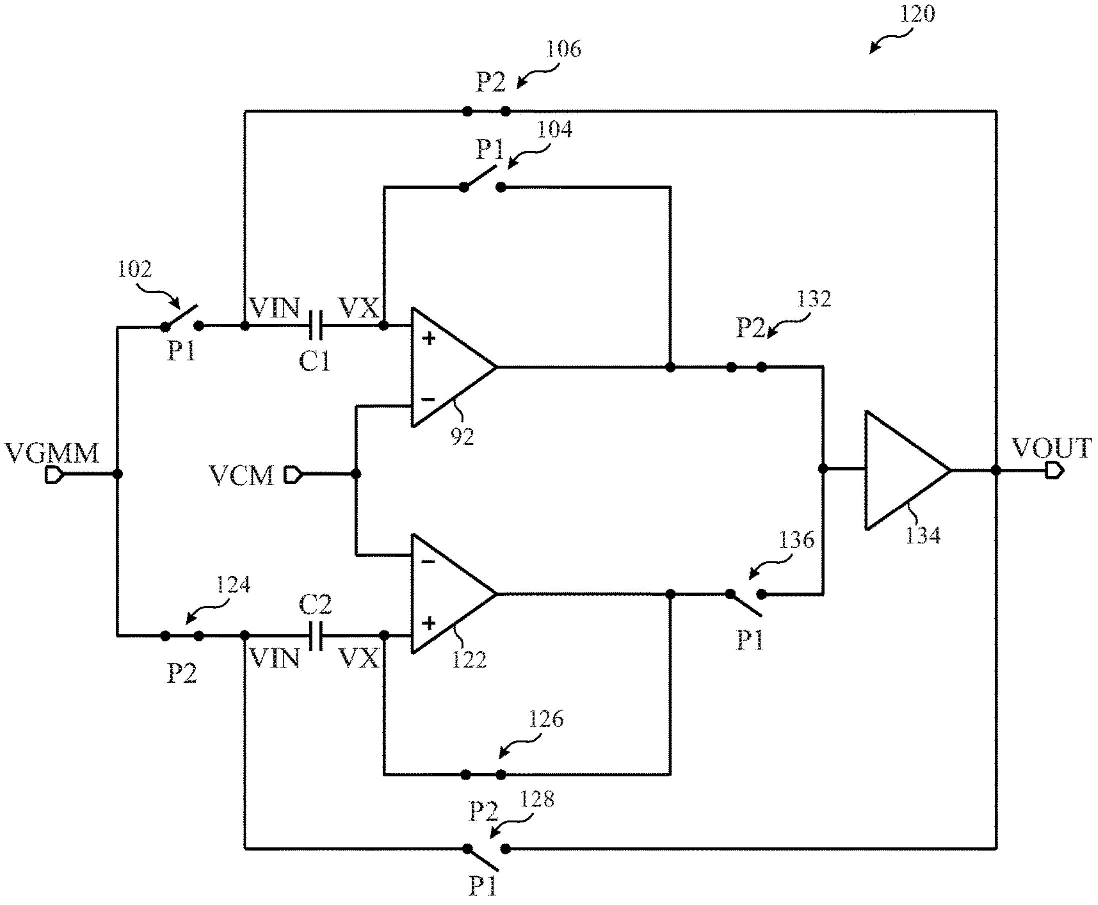
FIG. 14 illustrates a circuit diagram of another embodiment that may be employed to reduce the amount of time that the source driver waits to drive a pixel 56, in accordance with at least one embodiment.

FIG. 14 illustrates a circuit diagram 120 of another embodiment that may be employed to reduce the amount of time that the source driver 82 waits to drive a pixel 56. As shown in FIG. 14, the circuit 120 may include a similar circuit as described above with respect to FIG. 10. However, in addition to the circuit components of FIG. 10, the circuit diagram 120 includes mirror circuit components. That is, the circuit 120 includes a second amplifier 122, switch 124, switch 126, and switch 128 that mirror the amplifier 92, switch 102, switch 104, and switch 106, respectively. Although switch 124, switch 126, and switch 128 mirror switch 102, switch 104, and switch 106, each respective set of switches operates with respect to opposite phases (e.g., sample/drive phase). That is switches 102 and 104, which mirror switches 124 and 126, operate according to opposite phases as compared to switches 124 and 126. As such, when switches 102 and 104 are open as shown in FIG. 14, switches 124 and 126 are closed.

With this in mind, the circuit 120 may also include switch 132 that may couple the output of the amplifier 92 to an amplifier 134. In addition, the circuit 120 may include switch 136 that may couple the output of the amplifier 122 to the amplifier 134. The switches 132 and 134 may operate in opposite phases with respect with each other, thereby sharing the amplifier 134. The amplifier 134 may amplify the output voltage provided by the amplifier 92 or the amplifier 122.

In operation, the circuit 120 may coordinate the positions of the switches 102, 104, and 106 in a particular mode of operation, such as the drive mode, as depicted in FIG. 14. In some embodiments, the operation may be coordinated by control (e.g., phase) signals received from a timing controller (TCON) in the display 12. In operation, the voltage stored in the first capacitor C1 may be provided to the amplifier 92 via the inverting terminal and the output voltage of the amplifier 92 may be provide to the amplifier 134. The output of the amplifier 134 may then be supplied to a respective data line and respective pixel 56.

While the amplifier 92 is operating in the drive mode, the switches 124, 126, and 128 may be positioned according to a sample mode of operation. That is, the analog voltage signal (Vgmm) provided via the gamma DAC 84 for a subsequent pixel 56 may be provided to the second capacitor C2 via the switch 124. Since the switch 126 may also be closed, the offset of the amplifier 122 may be canceled out as described above with respect to FIG. 11. After the amplifier 92 completes its drive mode, the amplifier 92 may change into a sample mode of operation and thus close switches 102 and 104 and open switches 106 and 132. During this time, the amplifier 122 may switch into a drive mode of operation and open switches 124 and 126 and close switches 128 and 136. As such, the amplifier 122 may drive a respective pixel 56 via the respective data line 62.

Accordingly, at any given time, the circuit 120 is driving one pixel and simultaneously charging a capacitor to be used to drive the next pixel 56 coupled to the circuit 120. By operating in the sampling mode and the driving mode at the same time, the circuit 120 enables the source driver 82 to further reduce the amount of time that it waits for analog voltage signals (Vgmm) output via the gamma DAC 84 to settle. In addition, the architecture of the circuit 120 provides auto-zeroing capabilities that cancel the offset voltages of each amplifier 92 and 122, thereby improving the quality of the voltage signal provided to the pixel and improving the quality of the image depicted in the display 18.

It should be noted that, in some embodiments, the operation schemes described herein may involve a duplication of input circuitry on the source driver 82. Moreover, the alternate phases of operation are made available by utilizing units of line time as phases themselves. In this way, the duplicated circuitry may provide an auto-zero benefit, while preventing an offset of the source driver 82 from drifting over temperature and reducing the 1/f noise contribution from the source driver 82. In addition, the overall power used may be reduced due to the longer available settling time.

It should also be noted that, in some embodiments, the balanced architecture scheme illustrated in FIG. 13 may also be incorporated into the circuit 120 of FIG. 14 to cancel out various charges that may influence the voltage provided to the pixel 56. Although the circuit 120 includes more amplifiers as compared to the other embodiments described herein, the power consumption of the three amplifiers operating with each other may provide improved power savings as compared to the other embodiments.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A display device, comprising: a plurality of rows of pixels configured to display image data on a display; a digital-to-analog converter configured to output a voltage that corresponds to a luminance value to be depicted on a first pixel of the plurality of rows of pixels; and a circuit configured to amplify the voltage and output an amplified voltage to the first pixel, wherein the amplified voltage is configured to cause the first pixel to illuminate according to the luminance value, and wherein the circuit comprises: a capacitor configured to receive the voltage via the digital-to-analog converter; an amplifier coupled to the capacitor, wherein the amplifier is configured to generate the amplified voltage based on the voltage stored in the capacitor, wherein the capacitor is coupled to a first input of the amplifier; and a plurality of switches comprising: a first switch configured to couple a first terminal of the capacitor to an output of the amplifier during a first amount of time; a second switch configured to couple a second terminal of the capacitor to the output of the amplifier after the first amount of time expires, wherein the first switch and the second switch are configured to simultaneously uncouple the first terminal of the capacitor to the output of the amplifier and couple the second terminal to the output of the amplifier; and a third switch configured to couple a third terminal of an additional capacitor to a fixed common mode voltage, wherein the third terminal is coupled to a second input of the amplifier, and wherein the third switch and the second switch are configured to simultaneously couple the fixed common mode voltage to the second input of the amplifier and couple the second terminal to the output of the amplifier.

2. The display device of claim 1, wherein the first switch is configured to couple the first terminal of the capacitor to the digital-to-analog converter after the first amount of time expires.

3. The display device of claim 1, wherein the first switch is electrically in series with the first terminal of the capacitor and the output of the amplifier.

4. The display device of claim 1, wherein the second switch is electrically in series with the second terminal of the capacitor and the output of the amplifier.

5. The display device of claim 1, wherein the plurality of switches comprises a fourth switch coupled between the first terminal of the capacitor and the digital-to-analog converter.

6. The display device of claim 5, wherein the amplifier is configured to cancel one or more offset properties associated with the amplifier after the first amount of time expires based on the voltage provided to the capacitor via the digital-to-analog converter and a feedback from the output of the amplifier to an inverting terminal of the amplifier.

7. The display device of claim 1, wherein the capacitor is coupled to the first input of the amplifier, wherein the first input corresponds to an inverting input of the amplifier, and wherein the fixed common mode voltage is coupled to the second input of the amplifier, wherein the second input corresponds to a non-inverting input of the amplifier.

8. A circuit configured to output an amplified voltage to a pixel of a display, wherein the circuit comprises: a first capacitor configured to receive a voltage via digital-to-analog converter, wherein the voltage is associated with a luminance value for the pixel; a second capacitor configured to receive a fixed common mode voltage; an amplifier coupled to the first capacitor and the second capacitor, wherein the amplifier is configured to generate the amplified voltage based on the voltage stored in the first capacitor; and a plurality of switches comprising: a first switch configured to: couple a first terminal of the first capacitor to an output of the amplifier during a first amount of time; a second switch configured to: couple a second terminal of the first capacitor to the output of the amplifier after the first amount of time expires, wherein the first switch and the second switch are configured to simultaneously uncouple the first terminal of the first capacitor to the output of the amplifier and couple the second terminal to the output of the amplifier; a third switch configured to couple the fixed common mode voltage to a third terminal of the second capacitor during the first amount of time; and a fourth switch configured to couple the fixed common mode voltage to a fourth terminal of the second capacitor after the first amount of time expires, wherein the third switch and the fourth switch are configured to simultaneously uncouple the fixed common mode voltage to the third terminal and couple the fixed common mode voltage to the fourth terminal.

9. The circuit of claim 8, wherein a first charge stored on the third switch is canceled via the amplifier by a second charge stored on the fourth switch.

10. The circuit of claim 8, wherein a first noise signal associated with the first capacitor is canceled via the amplifier by a second noise signal associated with the second capacitor.

11. The circuit of claim 8, wherein the first capacitor is coupled to an inverting terminal of the amplifier and the second capacitor is coupled to a non-inverting terminal of the amplifier.

12. An electronic display device, comprising:

a plurality of pixels configured to display image data on the electronic display device;

a digital-to-analog converter configured to output a first voltage and a second voltage that correspond to a first luminance value and a second luminance value to be depicted on a first pixel and a second pixel of the plurality of pixels, respectively;

a circuit configured to amplify the first voltage and the second voltage, output a first amplified voltage to the first pixel, and output a second amplified voltage to the second pixel, wherein the first amplified voltage is configured to cause the first pixel to illuminate according to the first luminance value, wherein the second amplified voltage is configured to cause the second pixel to illuminate according to the second luminance value, and wherein the circuit comprises:

a first amplifier configured to generate the first amplified voltage based on the first voltage stored in a first capacitor configured to receive the first voltage via the digital-to-analog converter;

a second amplifier configured to generate the second amplified voltage based on the second voltage stored in a second capacitor configured to receive the second voltage via the digital-to-analog converter; and a plurality of switches configured to:

couple a first output of the first amplifier to the first pixel during a first amount of time; and couple a second output of the second amplifier to the second pixel after the first amount of time expires.

13. The electronic display device of claim 12, comprising a third amplifier configured to receive either the first output or the second output, wherein the third amplifier is configured to provide the first amplified voltage to the first pixel during the first amount of time and provide the second amplified voltage to the second pixel after the first amount of time expires.

14. The electronic display device of claim 12, wherein the plurality of switches comprises:

a first switch configured to couple the digital-to-analog converter to the second capacitor during the first amount of time; and a second switch configured to couple the digital-to-analog converter to the first capacitor after the first amount of time expires.

15. The electronic display device of claim 12, wherein the first amplifier and the second amplifier are coupled to a common mode voltage via a respective non-inverting terminal.

16. The electronic display device of claim 12, wherein the second capacitor is charged to the second voltage when the first output of the first amplifier is coupled to the first pixel during the first amount of time.

17. The electronic display device of claim 12, wherein the first capacitor is charged to the first voltage before the first output of the first amplifier is coupled to the first pixel during the first amount of time.

* * * * *